United States Patent
Branca

(10) Patent No.: US 10,003,174 B1
(45) Date of Patent: Jun. 19, 2018

(54) SINUSOIDAL OPTICAL EMISSION METHOD, AND CORRESPONDING CIRCUIT

(71) Applicant: STMicroelectronics (Alps) SAS, Grenoble (FR)

(72) Inventor: Xavier Branca, Sassenage (FR)

(73) Assignee: STMICROELECTRONICS (ALPS) SAS, Grenoble (FR)

( * ) Notice: Subject to any disclaimer, the term of this patent is extended or adjusted under 35 U.S.C. 154(b) by 0 days. days.

(21) Appl. No.: 15/598,113

(22) Filed: May 17, 2017

(30) Foreign Application Priority Data

Dec. 16, 2016 (FR) ...................... 16 62640

(51) Int. Cl.
| | |
|---|---|
| *H01S 5/00* | (2006.01) |
| *H01S 5/062* | (2006.01) |
| *H01S 5/42* | (2006.01) |
| H01S 5/40 | (2006.01) |
| H01S 5/183 | (2006.01) |

(52) U.S. Cl.
CPC .......... *H01S 5/06216* (2013.01); *H01S 5/062* (2013.01); *H01S 5/4025* (2013.01); *H01S 5/423* (2013.01); *H01S 5/183* (2013.01); *H01S 5/405* (2013.01); *H01S 5/42* (2013.01)

(58) Field of Classification Search
CPC . H01S 5/062; H01S 5/423; H01S 5/42; H01S 5/06216; H01S 5/405; H01S 5/4025; H01S 5/183
See application file for complete search history.

(56) References Cited

U.S. PATENT DOCUMENTS

| | | | | |
|---|---|---|---|---|
| 6,822,687 | B1* | 11/2004 | Kakiuchi | G01C 3/08 348/207.99 |
| 8,594,144 | B1* | 11/2013 | Bagg | F41G 3/145 372/25 |
| 2003/0002790 | A1* | 1/2003 | Johnson | G02B 27/0087 385/33 |
| 2006/0158268 | A1* | 7/2006 | McCorquodale | G06F 1/04 331/34 |
| 2007/0092177 | A1* | 4/2007 | Nilsson | B82Y 20/00 385/14 |
| 2014/0362364 | A1* | 12/2014 | Waligorski | G01S 17/36 356/5.01 |
| 2015/0362585 | A1* | 12/2015 | Ghosh | G01S 7/4815 250/208.1 |

\* cited by examiner

*Primary Examiner* — Kinam Park
(74) *Attorney, Agent, or Firm* — Slater Matsil, LLP

(57) ABSTRACT

An optical emitting circuit includes an array of M optical sources distributed in N groups, where N is lower than M. A controller is configured to generate N periodic square wave control signals that are successively mutually phase shifted by pi/N and that all have the same period, and to cyclically activate/deactivate all the optical sources of the N groups using the control signals. The optical emitting circuit is configured so that each group is activated when a corresponding control signal is in its first state and deactivated when the corresponding control signal is in its second state. The number of optical sources in each group and the order of the groups in the sequence of activations/deactivations are chosen so as to generate an optical signal having an amplitude that sinusoidally varies in steps.

20 Claims, 3 Drawing Sheets

SINUSOIDAL OPTICAL EMISSION METHOD, AND CORRESPONDING CIRCUIT

CROSS-REFERENCE TO RELATED APPLICATIONS

This application claims priority to French Patent Application No. 1662640, filed on Dec. 16, 2016, which application is hereby incorporated herein by reference.

TECHNICAL FIELD

Implementations and embodiments of the invention relate to a sinusoidal optical emission method and a corresponding a circuit.

BACKGROUND

An optical emitting circuit can be incorporated, for example, into electronic devices such as tablets or cellular mobile telephones for applications based on the use of the principle of indirect time-of-flight (iToF) or of light fidelity (LiFi).

In general, an optical emitting circuit able to apply the indirect time-of-flight principle emits optical pulses, for example, infrared optical radiation in the form of a square wave, towards a scene. Two-dimensional or even three-dimensional elements of the scene return these optical pulses to a sensor of the circuit, which comprises an array of detecting pixels. The shifts in the phase of the optical pulses between the emission and reception of these pulses are measured by the sensor so as to determine indirectly the time-of-flight of these pulses and the distances between the elements of the scene and the circuit, thereby advantageously allowing the bulk and cost of the circuit to be decreased while preserving a reasonable precision with respect to an equivalent "direct time-of-flight" sensor.

However, there is a need to carry out such a phase-shift measurement for sinusoidal optical signals, as this is advantageously simpler than for square wave optical signals.

SUMMARY

Implementations and embodiments of the invention relate to electronic circuits and, in particular embodiments, to optical emitting circuits, such as circuits equipped with vertical cavity surface emitting laser diodes (VCSELs) intended to emit sinusoidal optical signals.

Thus, according to one implementation and embodiment, low-complexity technical solution can be provided for piloting a sinusoidal optical emitting circuit including laser diodes emitting optical signals at a frequency possibly ranging up to 500 MHz with an average power possibly ranging up to ten watts.

According to one aspect, a method for controlling an array of M optical sources is proposed. The M optical sources are distributed in N groups, with N lower than M. This method comprises cycles of respective and sequential activations/deactivations of all the optical sources of the N groups using N periodic square wave control signals that are successively mutually phase shifted by pi/N and that all have the same period. Each control signal possesses a first state, a second state, the same period, and a duty cycle of ½. Each group is activated when the corresponding control signal is in its first state and deactivated when the control signal is in its second state. The number of optical sources in each group and the order of the groups in the sequence of the activations/deactivations are chosen so as to generate an optical signal the amplitude of which varies in steps sinusoidally.

The N control signals may, for example, be generated from a reference signal advantageously but not necessarily having the same period as that of the control signals. The total current flowing through all the optical sources of the N groups is regulated depending on the product of a reference current multiplied by the duty cycle of the reference signal.

Such a method advantageously allows, on the basis of a square wave reference signal, an optical signal of sinusoidal amplitude to be emitted at a high frequency and with a high average power.

Moreover, here the N control signals are configured to have a duty cycle of ½ so as to ensure the symmetry of the sinusoidal optical signal.

Preferably but nonlimitingly, each cycle of sequences of activations/deactivations commences with an activation of an initial number of groups together containing a percentage of laser diodes of the array of laser diodes equal to the duty cycle of the reference signal.

Advantageously, the sequential and periodic activations/deactivations of the various corresponding groups of optical sources cause a variation in the overall optical intensity of the optical pulses generated by the optical sources of the array. This variation in overall optical intensity is directly related to the variation in the total current flowing through all the optical sources of the N groups. As will be seen further on in the description, when the variation in the total current has the shape of a sinusoidal signal the overall optical intensity generates an optical signal the amplitude of which varies in steps, sinusoidally. The maximum amplitude of this optical signal is reached when all the M optical sources of the array are simultaneously activated. Then, at that moment, the amplitude of the total current is equal to that of the reference current.

The optical sources of the array may advantageously be vertical cavity surface emitting laser diodes.

According to another aspect, an optical emitting circuit is proposed. This circuit comprises ¶ An Array of M optical sources distributed in N groups, with N lower than M. A controller is configured to generate N periodic square wave control signals that are successively mutually phase shifted by pi/N and that all have the same period. Each control signal has a first state, a second state, and a duty cycle of ½. The controller is also configured to cyclically activate/deactivate all the optical sources of the N groups respectively and sequentially using the N control signals.

Each group is activated when the corresponding control signal is in its first state and deactivated when the control signal is in its second state. The number of optical sources in each group and the order of the groups in the sequence of the activations/deactivations are chosen so as to generate an optical signal the amplitude of which varies in steps sinusoidally.

According to one embodiment, the controller includes a signal source configured to generate the N control signals from a reference signal advantageously having the same period as that of the control signals, and N switches that are coupled between a power source controlled by a regulator and the N groups of optical sources, the regulator being configured to regulate the total current flowing through all the optical sources of the N groups depending on the product of a reference current multiplied by the duty cycle of the reference signal.

According to one embodiment, the controller is configured to make each cycle of sequences of activations/deactivations start with an activation of an initial number of groups together containing a percentage of laser diodes of the array of laser diodes equal to the duty cycle of the reference signal.

By way of indication and not by way of limitation, the circuit may, for example, furthermore comprise a control unit configured to deliver a reference current to the regulator.

According to another embodiment, the regulator includes a low-pass filter having a cut-off frequency the ratio of which to the frequency of the reference signal is lower than $1/10$.

Moreover, advantageously, the optical sources of a given group of the array do not make mutual contact.

In other words, the optical sources of a given group are dispersed throughout the array so that they make direct contact only with the optical sources of another group, this making it possible to make the emission of the sinusoidal optical signal more uniform.

According to yet another embodiment, the optical sources of the array are vertical cavity surface emitting laser diodes (VCSELs).

Moreover, the optical emitting circuit may also be produced as a single integrated circuit.

According to another aspect, an emitter that is intended to apply the indirect time-of-flight principle and that incorporates an emitting circuit such as described above is proposed.

According to yet another aspect, an electronic device, for example, such as a tablet or cellular mobile telephone, incorporating an emitter such as defined above is proposed.

BRIEF DESCRIPTION OF THE DRAWINGS

Other advantages and features of the invention will become apparent on studying the detailed description of implementations and embodiments, which is given by way of nonlimiting example and illustrated by the appended drawings, in which.

DETAILED DESCRIPTION OF ILLUSTRATIVE EMBODIMENTS

Figure 1:
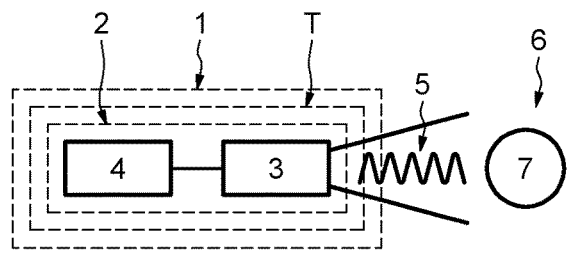
FIGS. 1 to 6 relate to various implementations and embodiments of the invention.

FIG. 1 schematically illustrates an electronic device 1, here a cellular mobile telephone, incorporating an optical emitter T configured to apply the principle of indirect time-of-flight (iToF). The emitter T itself incorporates an optical emitting circuit 2 according to one embodiment of the invention. It will be noted that the electronic device 1 furthermore comprises a sensor (not shown) that may be produced in the same integrated circuit as the emitter T or in a different integrated circuit.

Figure 2:
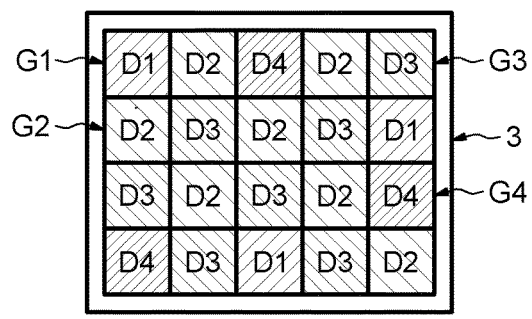
Figure 3:
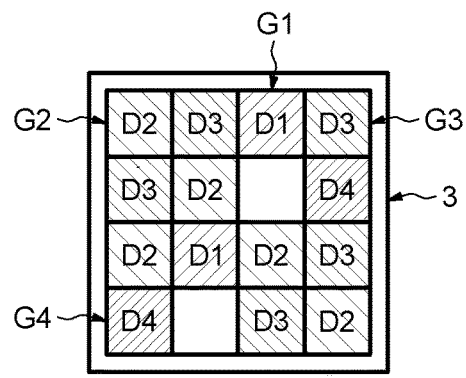

The optical emitting circuit 2 comprises an optical emitter, for example, an array 3 of optical sources including M optical sources, here vertical cavity surface emitting laser diodes (VCSELs) exemplary arrangements of which are illustrated in detail in FIGS. 2 and 3, and a controller 4 configured to control the array 3 of optical sources so that it emits an optical signal 5 the amplitude of which varies in steps sinusoidally toward a scene 6 with a view to indirectly determining the time-of-flight of the optical signal 5 by measuring the shift in the phase of the optical signal 5 between the emission and reception of this signal 5 following its reflection from the objects 7 in the scene 6.

Reference is now made to FIGS. 2 and 3 to illustrate in greater detail possible embodiments of the array 3 of optical sources.

FIG. 2 illustrates an array, for example, including 20 laser diodes (VCSELs). In order to generate the optical signal 5 details of which will be given further on in the description and with reference to FIG. 6, the matrix array 3 of optical sources is partitioned into N groups, for example, into four independent groups G1 to G4.

Moreover, each group of the array 3 includes a number of laser diodes. For example, the first and fourth groups G1 and G4 can each include three laser diodes D1 and D4 whereas the second and third groups G2 and G3 can each include seven laser diodes D2 and D3. Thus, the four groups respectively represent 15%, 35%, 35% and 15% of the total number of laser diodes, here twenty optical sources, in the array 3.

As will be seen below, during a control cycle, the groups G1 to G4 are sequentially activated one by one, one after another in an activation order that is predefined so that the number of activated groups increments by one until all the groups are activated. When a group Gi is activated, all the laser diodes Di of the activated group Gi are activated.

Then the groups are sequentially deactivated one by one, one after another in a deactivation order that is the inverse of the activation order, so that the number of activated groups decrements by one until all the groups are deactivated.

When a group Gi is deactivated, all the laser diodes Di of the deactivated group are deactivated.

The control cycle is repeated a plurality of times, and the number of laser diodes in each group G1 to G4 and the order of these groups G1 to G4 in the sequences of activation and deactivation are advantageously chosen so as to generate the optical signal 5.

The starting point of a control cycle, which is also the endpoint of this cycle, is not necessarily that corresponding to an activation of none of the groups, but may in practice, and preferably, be that corresponding to an activation of an initial number of groups, for example, two groups, together containing a certain percentage of laser diodes of the array of laser diodes, as will be seen in more detail below.

As a variant, FIG. 3 illustrates another embodiment of the array including 14 diodes also divided into four groups G1 to G4.

In this arrangement of diodes of the array 3, the first and fourth groups G1 and G4 each include two laser diodes D1 and D4 whereas the second and third groups G2 and G3 each include five laser diodes D2 and D3. Thus, the four groups respectively represent about 14%, 36%, 36% and 14% of the total number of laser diodes, here 14 optical sources, in the array 3. The white boxes illustrated in FIG. 3 signify the non-presence of a diode in this position of the array 3.

Advantageously, the arrangement of diodes of the array 3 illustrated in FIG. 3 is capable of generating the optical signal 5 the stepwise amplitude variation of which corresponds the best to a sinusoidal variation.

As illustrated in FIGS. 2 and 3, the laser diodes of a given group do not make mutual contact in order to better disperse the laser diodes of each group G1 to G4 within the array 3. Thus, the overall optical intensity of optical pulses emitted toward the scene 6 by the laser diodes of the array 3 is spatially more uniform.

It will be noted that there are also other possible ways of partitioning the array 3 and of ordering the activation/deactivation of the optical sources of the array 3 to generate sinusoidal optical signals according to the invention.

Figure 4:
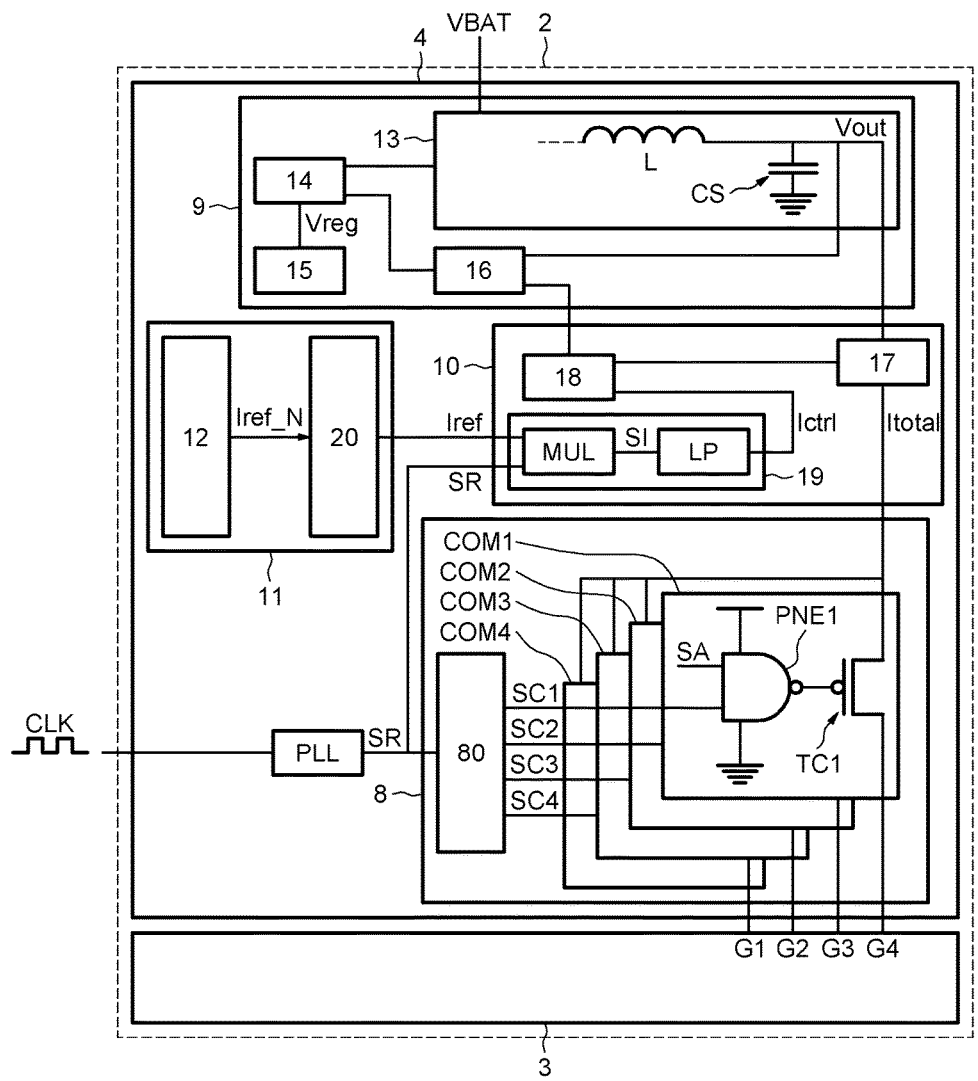

FIG. 4 illustrates a detailed example of the internal structure of the optical emitting circuit 2.

The circuit 2 comprises the array 3 of optical sources (already described with reference to FIG. 2 or 3) and the controller 4 an exemplary embodiment of which will be presented in detail below.

The controller 4 includes an input stage PLL that is intended to receive a square wave external clock signal CLK and comprising a phase-locked loop (PLL) configured to generate a square wave reference signal SR at a frequency possibly, for example, ranging up to 500 MHz.

The controller 4 furthermore includes a control-signal source 8 that is intended to receive the reference signal SR.

It will be noted that the reference signal SR possesses a duty cycle R that preferably but nonlimitingly is equal to ½.

Moreover, the signal source 8 comprises a delay-locked loop (DLL) 80 configured to generate, from the reference signal SR, N square wave control signals, here, for example, four control signals, SC1 to SC4, for controlling four switches COM1 to COM4. The control signals SC1 to SC4 each have a duty cycle R of ½ and are phase shifted from one another by a phase shift of pi/N, i.e., pi/4.

The controller 4 furthermore comprises a power source 9 that is coupled to the array 3 of optical sources via a regulator 10, and a control unit 11 that is configured to deliver to the regulator 10 an analogue reference current Iref.

The switches COM1 to COM4 are advantageously power switches that are coupled between the anodes of the laser diodes D1 to D4 of the array 3 and the supply voltage of these diodes D1 to D4, i.e., here the output voltage Vout of the power source 9.

Each switch COM1 to COM4 includes an identical control transistor TC1 (TC2 to TC4 are not shown in FIG. 4) controlled by a piloting circuit, for example, here a NAND gate PNE1 (PNE2 to PNE4 are not shown in FIG. 4) a first input of which receives an authorization signal SA, a second input of which receives the corresponding control signal SCi and the output of which is coupled to the gate of the corresponding control transistor TCi. The drain of each control transistor TCi is coupled to all the laser diodes of the corresponding group Gi within the array 3 of optical sources.

When the control signals SC1 to SC4 are in their high state, the corresponding switches COM1 to COM4 are in their on state so as to activate the corresponding laser diodes.

When the control signal SCi is in its low state, the switch COMi is turned off and the diodes of the group Gi are deactivated.

The control unit 11, for example, here comprises a digital control unit 12 that is intended to deliver a digital reference current Iref_n to a digital-analogue converter 20 so as to form the reference current Iref.

The power source 9 comprises a switched-mode power source 13 (known per se) having an inductor L coupled to the output of the source and connected to ground by an output capacitor CS. The source 13 is supplied with a supply voltage VBAT and controlled by a pulse-width-modulator 14. A ramp generator 15 is coupled to the modulator 14. A servocontroller 16 is intended to deliver, to the modulator 14, a regulating voltage Vreg so as to control the output voltage Vout of the switched-mode power supply 13 dependent on a control voltage Vctrl produced by the regulator 10. To do this, the output voltage Vout is also delivered to an input of the servocontroller 16 by way of feedback voltage. In this example, the servocontroller 16 is a proportional-integral-derivative PID voltage controller.

The output voltage Vout is here also used to power all the NAND gates PNE1 (PNE2 to PNE4 are not shown in FIG. 4) of all the switches COM1 to COM4. The regulator 10 includes a current sensor 17 that is coupled between the output of the power source 9 and the four switches COM1 to COM4 of the signal source 8. The regulator also includes a PID voltage controller 18 that is coupled to the current sensor 17 and to a processing stage 19 that receives the reference current Iref.

The total current Itotal flowing through all the switches COM1 to COM4 is delivered by the switched-mode power source 13 and measured by the current sensor 17. The current sensor 17 furthermore includes a low-pass filtering stage (not shown) that is configured to apply a low-pass filter to the measured total current Itotal before delivering it to the PID controller 18.

The processing stage 19, for example, comprises a multiplier circuit MUL that receives the reference current Iref and the reference signal SR and that is configured to generate an intermediate signal SI.

As the duty cycle R of the reference signal SR is here set to ½, the average value of the intermediate signal SI represents half that of the reference current Iref.

The processing stage 19 furthermore includes a conventional low-pass filter LP configured to generate a control current Ictrl.

It will be noted that the cut-off frequency of the low-pass filter LP and that of the low-pass filtering stage are advantageously at least ten times smaller than that of the square wave reference signal SR. In other words, the ratio of the cut-off frequency of the filter LP or that of the filtering stage to the frequency of the square wave reference signal SR is lower than 1/10 so as to sufficiently filter the control current Ictrl and the total current Itotal.

Thus, the processing stage 19 receives the average value of the total current <Itotal> and the average value of the control current <Ictrl>=R*Iref=0.5*Iref. The average value of the total current <Itotal> is equal to half the peak value of the total current because this signal Itotal is delivered to the array 3 via the switches COM1 to COM4 that are controlled by the control signals SC1 to SC4 each of which has a duty cycle of ½. The processing stage 19 is configured to adjust the control voltage Vctrl so that the average values <Itotal> and <Ictrl> are equal.

Thus, the peak value of the total current Itotal is equal to that of the reference current Iref.

Figure 5:
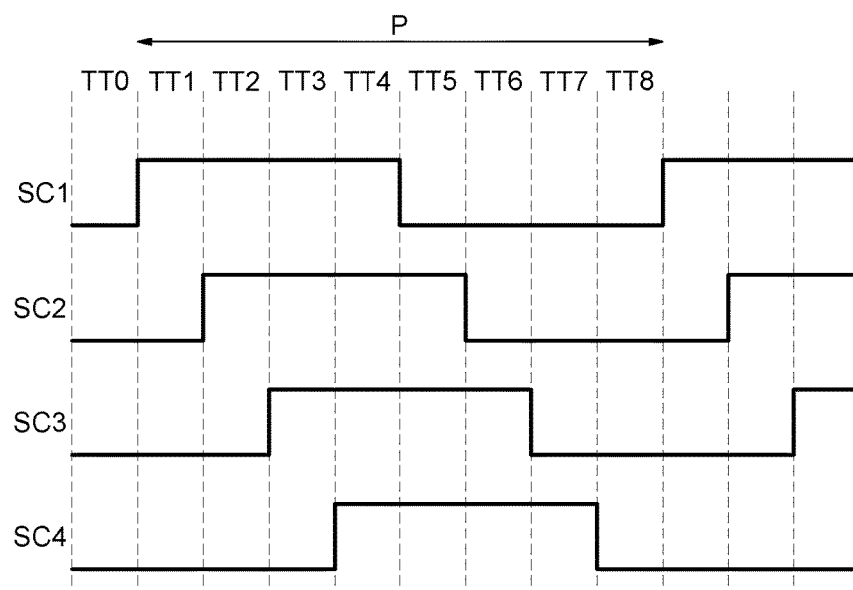
Figure 6:
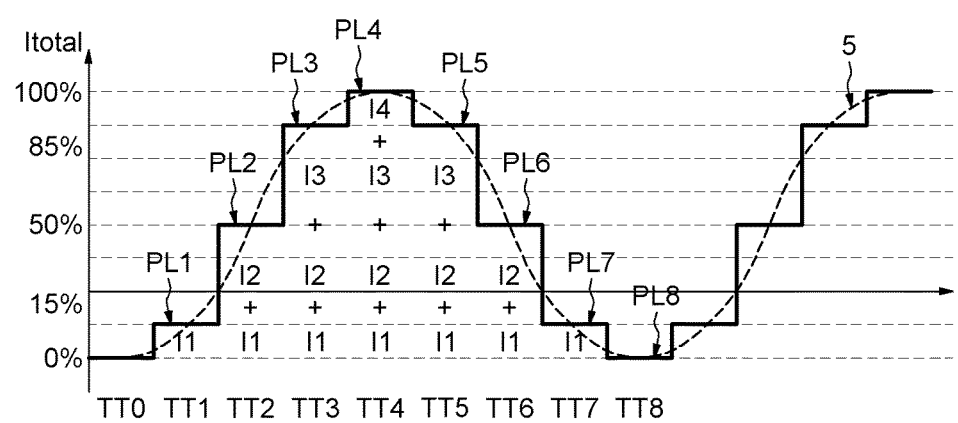

Reference is now made to FIGS. 5 and 6 to illustrate an exemplary way of operating the optical emitting circuit 2 presented in FIG. 4.

The phase shift generated by the delay-locked loop 80 depends on the number of groups. In the presented case where the number N is equal to four, the phase shift is equal to pi/4.

Therefore, the delay-locked loop 80 generates, from the square wave reference signal SR, four control signals SC1 to SC4 each having a duty cycle of ½, the signals being phase shifted from one another by pi/4 (FIG. 5). The period P of each control signal SCi is equal to the period of the reference signal SR.

Taking the case illustrated in FIG. 2 by way of example, the four control signals SC1 to SC4 are respectively delivered to the four groups G1 to G4 of optical sources that respectively represent 15%, 35%, 35% and 15% of the total number of optical sources of the array 3.

The period P is subdivided into successive temporal divisions TTi each having a duration equal to P/2N, i.e., here P/8.

In an initial temporal division TT0 (FIGS. 5 and 6) none of the control signals are in the high state, and thus none of the laser diodes are activated and there is no significant current flowing through the laser diodes of the array 3.

In the following first temporal division TT1 (FIGS. 5 and 6), only the first control signal SC1 is in the high state. The laser diodes D1 of the first group G1 are therefore activated.

As the number of laser diodes D1 of the first group G1 represents 15% of the total number of diodes of the array 3, the sum of the currents I1 flowing through the activated laser diodes, here the laser diodes D1 of the first group G1, forms a first step PL1 also representing 15% of the total current Itotal flowing through all the diodes of the array 3 when they are all simultaneously activated.

The emitted light intensity is therefore also equal to 15% of the total light intensity.

In the second temporal division TT2 (FIGS. 5 and 6) the first and second control signals SC1 and SC2 are both in the high state. The laser diodes D1 and D2 of these first and second groups G1 and G2 are therefore simultaneously activated.

The sum of the currents I1+I2 flowing through the activated laser diodes D1 and D2 forms a second step PL2 representing a higher cumulative percentage 50% (15%+35%) of the total current Itotal, which also corresponds to 50% of the total light intensity.

By analogy, in the third temporal division TT3 (FIGS. 5 and 6) the laser diodes D1 to D3 of the first, second and third groups G1 to G3 are simultaneously activated.

The sum of the currents I1+I2+I3 flowing through the activated laser diodes D1 to D3 forms a third step PL3 therefore representing an even higher cumulative percentage 85% (15%+35%+35%) of the total current Itotal.

In the same way, all the laser diodes D1 to D4 of the array 3 are activated and deactivated in the fourth and eighth temporal divisions TT4 and TT8, respectively.

The sum of the currents I1+I2+I3+I4 flowing through the activated laser diodes forms a fourth step PL4 representing the peak amplitude of the total current Itotal. As there is no significant current flowing through the array in the eighth temporal division TT8, the eighth step PL8 possesses a current amplitude of zero.

Thus, in the period P, the array 3 of optical sources generates an optical signal 5 (FIG. 6), the amplitude of the light intensity (which corresponds to the amplitude of the total current Itotal) of which varies in steps PL1 to PL8 sinusoidally. It will be noted that the peak value of the total current Itotal is equal to that of the reference current Iref.

In the example illustrated in FIGS. 5 and 6, the starting point (and the endpoint) of each control cycle corresponds to an activation of none of the groups.

This being so, although it is possible to use such a starting point, this starting point may be different.

Thus, in practice it is preferable to commence a cycle with activation of an initial number of groups together containing a percentage of laser diodes of the array of laser diodes equal to the duty cycle R of the reference signal SR, because the average value of the control signal Ictrl is set by this ratio.

Thus, in the case where the duty cycle of the reference signal is equal to 0.5, each cycle will preferably commence with activation of the groups GA and G2, which together contain 50% (15%+35%) of the laser diodes of the array 3 of laser diodes.

Thus, an optical emitting circuit comprising an array of M optical sources divided into N groups of optical sources is obtained, the circuit being configured to activate or deactivate cyclically and sequentially these groups so as to obtain an optical signal the amplitude of which varies in steps sinusoidally.

What is claimed is:

1. A method for controlling an array of M optical sources that are distributed in N groups, with N lower than M, the method comprising:
    performing cycles of respective and sequential activations/deactivations of all M optical sources of the N groups using N periodic square wave control signals that are successively mutually phase shifted by pi/N and that all have the same period;
    wherein each control signal has a first state, a second state, and a duty cycle of ½;
    wherein each group is activated when a corresponding control signal is in its first state and deactivated when the corresponding control signal is in its second state; and
    wherein the number of optical sources in each group and the order of the groups in the sequence of the activations/deactivations is chosen so as to generate an optical signal having an amplitude that sinusoidally varies in steps.

2. The method according to claim 1, wherein the N control signals are generated from a reference signal having the same period as the control signals and wherein the total current flowing through all the optical sources of the N groups is regulated depending on a product of a reference current multiplied by the duty cycle of the reference signal.

3. The method according to claim 1, wherein the N control signals are generated from a reference signal and each cycle of sequences of activations/deactivations commences with an activation of an initial number of groups together containing a percentage of optical sources of the array of optical sources equal to the duty cycle of the reference signal.

4. The method according to claim 1, wherein the array of optical sources comprises an array of vertical cavity surface emitting laser diodes.

5. An optical emitting circuit, comprising:
    an array of M optical sources distributed in N groups, where N is lower than M; and
    a controller configured to generate N periodic square wave control signals that are successively mutually phase shifted by pi/N and that all have the same period, and to cyclically activate/deactivate all the optical sources of the N groups respectively and sequentially using the N control signals;
    wherein each control signal has a first state, a second state, and a duty cycle of ½; and
    wherein the optical emitting circuit is configured so that each group is activated when a corresponding control signal is in its first state and deactivated when the corresponding control signal is in its second state, the number of optical sources in each group and the order of the groups in the sequence of activations/deactivations being chosen so as to generate an optical signal having an amplitude that sinusoidally varies in steps.

6. The optical emitting circuit according to claim 5, wherein the controller includes a signal source configured to generate the N control signals from a reference signal and configured to make each cycle of sequences of activations/deactivations start with an activation of an initial number of groups together containing a percentage of optical sources of the array of optical sources equal to the duty cycle of the reference signal.

7. The optical emitting circuit according to claim 5, wherein the optical sources of a given group of the array do not make mutual contact.

8. The optical emitting circuit according to claim 5, wherein the array of optical sources comprises an array of vertical cavity surface emitting laser diodes.

9. The optical emitting circuit according to claim 5, wherein the array of optical sources and the controller are integrated in a single integrated circuit chip.

10. The optical emitting circuit according to claim 5, wherein the optical emitting circuit is part of an emitter that is based on a principle of indirect time-of-flight.

11. An electronic device comprising the emitter of claim 10, wherein the electronic device comprises a tablet or cellular mobile telephone.

12. An optical emitting circuit, comprising:
an array of M optical sources distributed in N groups, where N is lower than M; and
a signal source configured to generate N periodic square wave control signals that are successively mutually phase shifted by pi/N and that all have the same period;
a regulator; and
N switches that are coupled between a power source controlled by the regulator and the N groups of optical sources;
where the M optical sources of the N groups are configured to be sequentially cyclically activated/deactivated using the N control signals;
wherein each control signal has a first state, a second state, and a duty cycle of ½; and
wherein the optical emitting circuit is configured so that each group is activated when a corresponding control signal is in its first state and deactivated when the corresponding control signal is in its second state, the number of optical sources in each group and the order of the groups in the sequence of activations/deactivations being chosen so as to generate an optical signal having an amplitude that sinusoidally varies in steps.

13. The optical emitting circuit according to claim 12, wherein the signal source is configured to generate the N control signals from a reference signal having the same period as the control signals.

14. The optical emitting circuit according to claim 13, wherein the regulator is configured to regulate the total current flowing through all the optical sources of the N groups depending on a product of a reference current multiplied by the duty cycle of the reference signal.

15. The optical emitting circuit according to claim 13, wherein the regulator includes a low-pass filter having a cut-off frequency, wherein a ratio of the cut-off frequency to the frequency of the reference signal is lower than 1/10.

16. The optical emitting circuit according to claim 12, wherein the signal source is configured to generate the N control signals from a reference signal, the optical emitting circuit configured to make each cycle of sequences of activations/deactivations start with an activation of an initial number of groups together containing a percentage of optical sources of the array of optical sources equal to the duty cycle of the reference signal.

17. The optical emitting circuit according to claim 12, wherein the optical sources of a given group of the array do not make mutual contact.

18. The optical emitting circuit according to claim 12, wherein the array of optical sources comprises an array of vertical cavity surface emitting laser diodes.

19. The optical emitting circuit according to claim 12, wherein the array of optical sources, the signal source, the regulator and the switches are integrated in a single integrated circuit chip.

20. The optical emitting circuit according to claim 12, wherein the optical emitting circuit is part of an emitter that is based on a principle of indirect time-of-flight.

* * * * *

UNITED STATES PATENT AND TRADEMARK OFFICE
CERTIFICATE OF CORRECTION

PATENT NO. : 10,003,174 B1  
APPLICATION NO. : 15/598113  
DATED : June 19, 2018  
INVENTOR(S) : Branca et al.

Page 1 of 1

It is certified that error appears in the above-identified patent and that said Letters Patent is hereby corrected as shown below:

On the Title Page

Item (72) Inventor, please delete "Inventor: Xavier Branca, Sassenage (FR)" and insert --Inventors: Xavier Branca, Sassenage (FR); Nicolas Moeneclaey, Vourey (FR)--.

Signed and Sealed this  
Tenth Day of November, 2020

Andrei Iancu  
*Director of the United States Patent and Trademark Office*